United States Patent
Tseng et al.

(10) Patent No.: US 6,559,016 B2
(45) Date of Patent: May 6, 2003

(54) METHOD OF MANUFACTURING LOW-LEAKAGE, HIGH-PERFORMANCE DEVICE

(75) Inventors: Hua-Chou Tseng, Hsinchu (TW); Tony Lin, Kaohsiung Hsien (TW)

(73) Assignee: United Microelectronics Corp., Hsinchu (TW)

( * ) Notice: Subject to any disclaimer, the term of this patent is extended or adjusted under 35 U.S.C. 154(b) by 200 days.

(21) Appl. No.: 09/733,822

(22) Filed: Dec. 5, 2000

(65) Prior Publication Data

US 2002/0068410 A1 Jun. 6, 2002

(51) Int. Cl.[7] .............................................. H01L 21/336
(52) U.S. Cl. ....................................... 438/302; 438/305
(58) Field of Search ................................. 438/301, 303, 438/305, 302

(56) References Cited

U.S. PATENT DOCUMENTS

| | | | | |
|---|---|---|---|---|
| 4,356,623 A | * | 11/1982 | Hunter | 257/344 |
| 5,580,799 A | * | 12/1996 | Funaki | 438/291 |
| 6,190,981 B1 | * | 2/2001 | Lin et al. | 438/290 |
| 6,218,226 B1 | * | 4/2001 | Lin et al. | 257/357 |
| 6,238,960 B1 | * | 5/2001 | Maszara et al. | 438/197 |
| 6,258,680 B1 | * | 7/2001 | Fulford et al. | 257/336 |
| 6,261,913 B1 | * | 7/2001 | Akram et al. | 438/305 |
| 6,281,062 B1 | * | 8/2001 | Sanchez | 257/335 |

* cited by examiner

Primary Examiner—Richard Booth
(74) Attorney, Agent, or Firm—Charles C.H. Wu; Wu & Cheung, LLP

(57) ABSTRACT

A method of manufacturing a low-leakage, high-performance device. A substrate having a gate electrode thereon is provided. A lightly doped, high-energy implantation is conducted to form a lightly doped source/drain terminal in the substrate. An offset spacer is formed on each sidewall of the gate electrode. A heavily doped implantation is conducted to form a heavily doped source/drain terminal in the substrate. The heavily doped source/drain terminal has a depth smaller than the lightly doped source/drain terminal. A protective spacer structure is formed on each sidewall of the gate electrode. A deep-penetration source/drain implantation is carried out to form a deep source/drain terminal in the substrate.

18 Claims, 6 Drawing Sheets

METHOD OF MANUFACTURING LOW-LEAKAGE, HIGH-PERFORMANCE DEVICE

BACKGROUND OF THE INVENTION

1. Field of Invention

The present invention relates to a method of manufacturing a semiconductor device. More particularly, the present invention relates to a method of manufacturing a low-leakage, high-performance device.

2. Description of Related Art

The trend in the development of very large scale integration (VLSI) circuits is the production of devices having smaller line width on a larger silicon chip. Hence, more functions can be integrated into an integrated circuit of a given size and production cost can be reduced. The characteristics of a metal-oxide-semiconductor transistor also change somewhat when the device is miniaturized. For example, operating speed of a transistor will increase when length of device channel is reduced.

However, miniaturization of device also brings the source and the drain terminals closer to each other. The depletion region in the source and the drain terminal formed when the MOS transistor is operating often results in some overlapping with the device channel. The shorter the channel, the greater will be the degree of overlapping of the depletion region in the source and the drain terminal with the channel. Aside from overlapping with the channel, a phenomenon known as hot electron effect also affects the operation of the MOS transistor when channel length is reduced. To resolve the problems, the most common method is to form a lightly doped drain (LDD) structure. Nevertheless, the formation of LDD is only good for device having a line width bigger than about 0.25 µm. In general, the method is useless in preventing the high leakage current that occurs in a device with a very short channel.

FIGS. 1A and 1B are schematic cross-sectional views showing the progression of steps for manufacturing a conventional low-leakage, high-performance device.

As shown in FIG. 1A, a gate electrode 102 is formed over a substrate 100. A lightly doped drain (LDD) implantation 104 of the substrate 100 is carried out to form a lightly doped drain terminal 106 in the substrate 100. A halo implantation 108 is next carried out to form a locally doped pocket 110 in the substrate 100 under the lightly doped drain terminal 106 on each side of the gate electrode 102. When line width of the device is smaller than 0.25 µm, a dosage greater than $10^{15}$ ions/cm$^2$ is used in the implantation 104.

As shown in FIG. 1B, spacers 112 are formed on the sidewalls of the gate electrode 102. A deep-penetration source/drain terminal implantation 114 is conducted to form a source/drain terminal 116.

FIG. 1C is a cross-sectional diagram showing in detail the structure after a thermal treatment of the device shown in FIG. 1B. As shown in FIG. 1C, a silicon chip must undergo a thermal treatment after implantation to compensate the amorphization that occurred near the surface of the chip. However, the thermal treatment will result in a greater range of diffusion for the ions, especially when the lightly doped source/drain terminal 106 is implanted using a dosage of about $10^{15}$ ions/cm$^2$. Ultimately, the lightly doped source/drain terminals 106a will overlaps considerably with the gate electrode 102.

In the aforementioned method of forming a MOS transistor, the high concentration LDD terminals often result in large overlapping with the gate after a thermal treatment. Too much overlapping may lead to a shortening of the channel between the source/drain terminals resulting in short-channel effect. To reduce overlapping, the obvious method is to reduce dopant concentration inside the LDD terminals. Yet, too little dopants may increase parasitic capacitance and ultimately lead to greater RC delay.

SUMMARY OF THE INVENTION

Accordingly, one object of the present invention is to provide a low-leakage, high-performance device capable of reducing overlapping between the lightly doped drain (LDD) terminals and the gate of the device due to a high dopant concentration in the LDD terminals, and at the same time also capable of reducing parasitic capacitance and hence RC delay due to a low dopant concentration in the LDD terminals.

To achieve these and other advantages and in accordance with the purpose of the invention, as embodied and broadly described herein, the invention provides a method of manufacturing a low-leakage, high-performance device. A substrate having a gate electrode thereon is provided. A lightly doped drain (LDD) implantation is conducted to form a lightly doped source/drain terminal in the substrate. An offset spacer is formed on each sidewall of the gate electrode. A heavy dopant implantation is conducted to form a heavily doped source/drain terminal in the substrate. The heavily doped source/drain terminal has a depth smaller than the lightly doped source/drain terminal. A protective spacer structure is formed on each sidewall of the gate electrode. Finally, a deep-penetration source/drain implantation is carried out to form a deep source/drain terminal in the substrate.

In addition, a halo implantation can be carried out after the lightly doped drain implantation to form a locally doped pocket on each side of the gate electrode under the LDD terminal. Similarly, a halo implantation can be carried out after the heavy dopant implantation to form a locally doped pocket on each side of the gate electrode under the LDD terminal.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
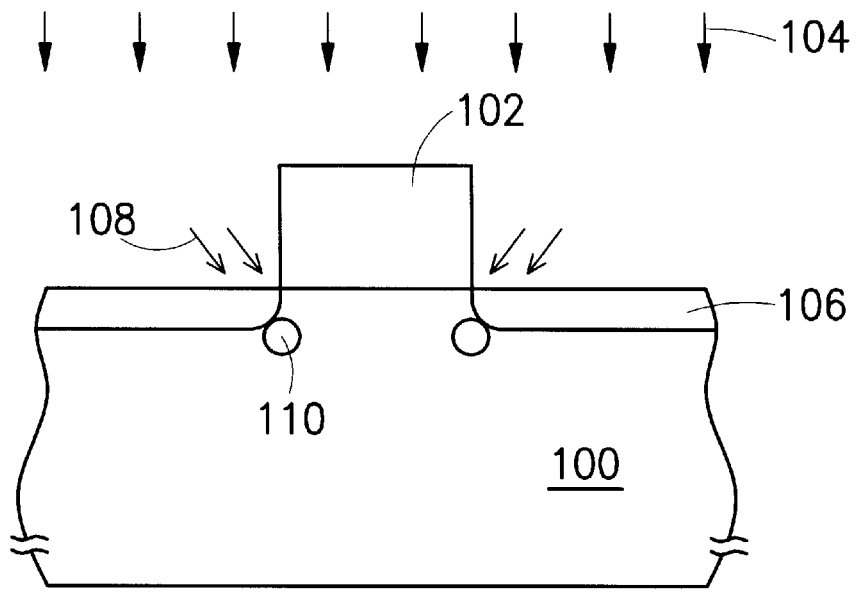
FIGS. 1A and 1B are schematic cross-sectional views showing the progression of steps for manufacturing a conventional low-leakage, high-performance device.
Figure 1B:
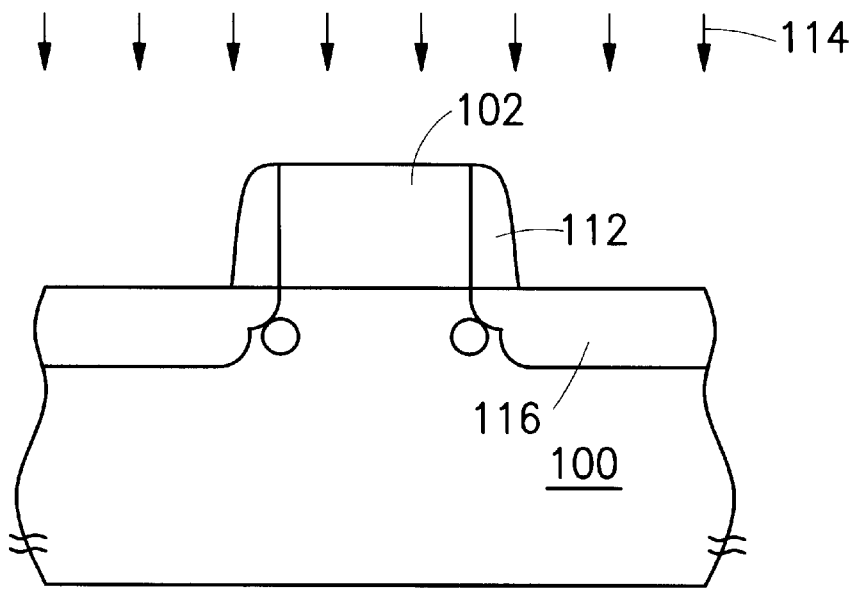
Figure 1C:
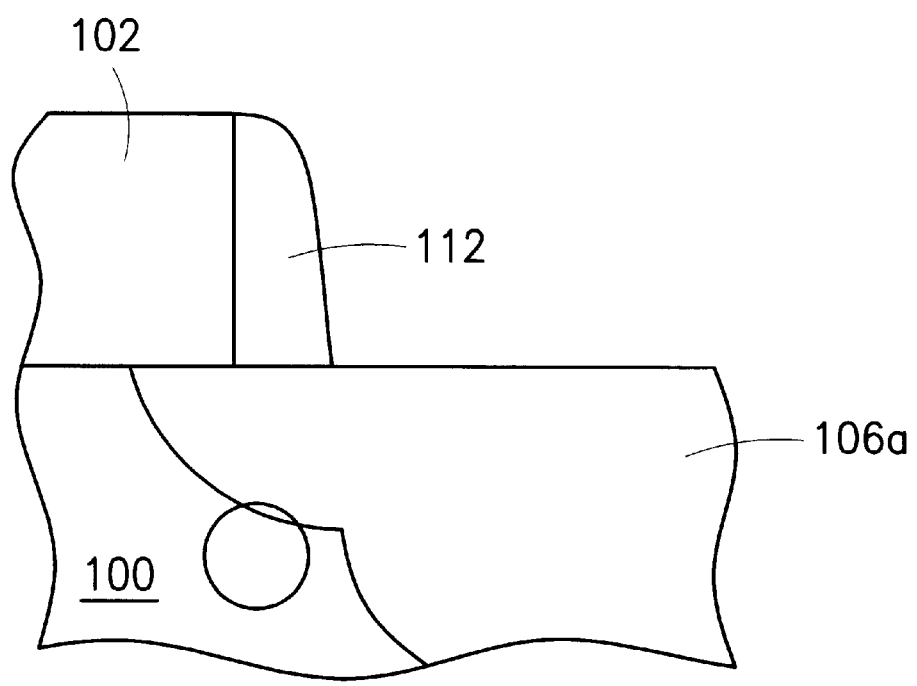
FIG. 1C is a cross-sectional diagram showing in detail the structure after a thermal treatment of the device shown in FIG. 1B.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
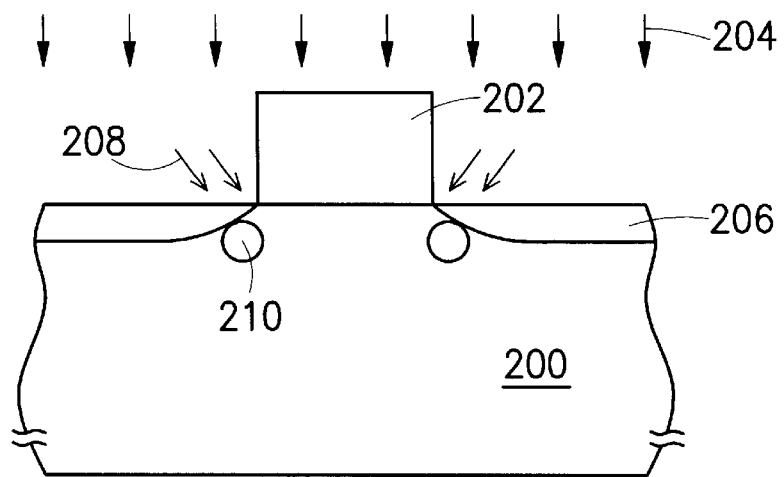
FIGS. 2A through 2C are schematic cross-sectional views showing the progression of steps for fabricating a low-leakage, high-performance device according to a first preferred embodiment of this invention.
Figure 2B:
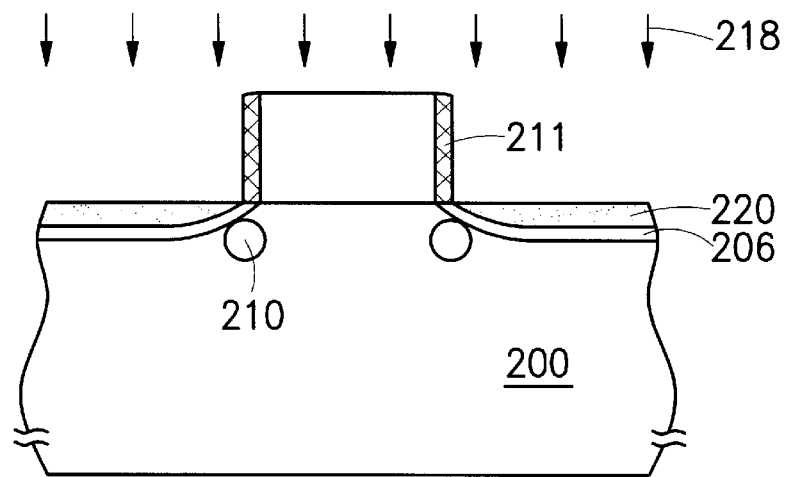
Figure 2C:
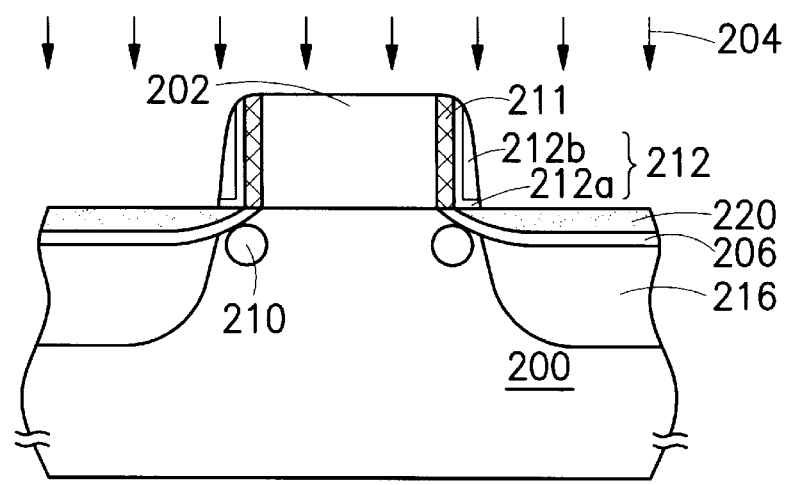

FIGS. 2A through 2C are schematic cross-sectional views showing the progression of steps for fabricating a low-leakage, high-performance device according to a first preferred embodiment of this invention.

As shown in FIG. 2A, a substrate 200 having a gate electrode 202 thereon is provided. A lightly doped drain (LDD) implantation 204 of the substrate 200 is conducted to form a lightly doped source/drain terminal 206 in the substrate 200. A halo implantation 208 is next conducted to form a locally doped pocket 210 on each side of the gate electrode 202 under the lightly doped source/drain terminal 206. A dosage of, for example, between about $10^{13} \sim 10^{14}$ ions/cm$^2$ is used to conduct the LDD implantation 204.

As shown in FIG. 2B, an offset spacer 211 is formed on each sidewall of the gate electrode 202. The offset spacer 211, for example, can be a silicon oxide layer having a thickness between about 100~500 Å. A heavily doped drain (HDD) implantation 218 is conducted to form a heavily doped source/drain terminal 220 in the substrate 200. The heavily doped source/drain terminal 220 has a depth smaller than the lightly doped source/drain terminal 206. A dosage of, for example, greater than $10^{15}$ ions/cm$^2$ is used to conduct the HDD implantation 228.

As shown in FIG. 2C, a spacer structure 212 is formed on each sidewall of the gate electrode 202 and above the substrate 200. The spacer structure 212 is formed, for example, by depositing an oxide protective layer 212a on the sidewalls of the gate electrode 202 and over the substrate 200 and then depositing a spacer layer 212b over the protective layer 212a. The spacer layer 212b can be a silicon nitride layer, for example. A deep-penetrating source/drain implantation 214 is conducted to form a deep source/drain terminal 216.

Figure 2D:
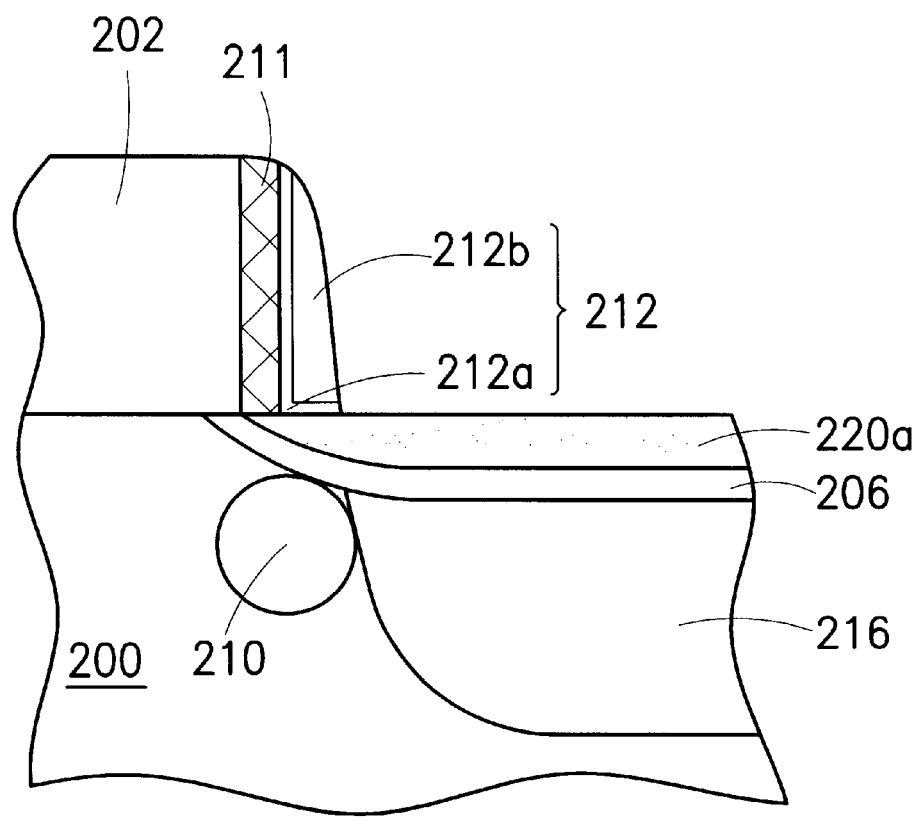
FIG. 2D is a cross-sectional diagram showing in detail the structure after a thermal treatment of the device shown in FIG. 2C.

FIG. 2D is a cross-sectional diagram showing in detail the structure after a thermal treatment of the device shown in FIG. 2C. Since a portion of the energy in ion implantation is applied close to the surface of the silicon layer, crystalline structure is destroyed and turned into an amorphous silicon layer. Hence, a thermal treatment of the silicon chip is required to compensate for the surface amorphization. During thermal treatment, dopants in the heavily doped source/drain terminal 220 are prevented from diffusing through the offset spacer 211. Therefore, no dopants can be driven into the region directly underneath the gate electrode 202 to cause a shortening of the channel between the source/drain terminal.

Figure 3A:
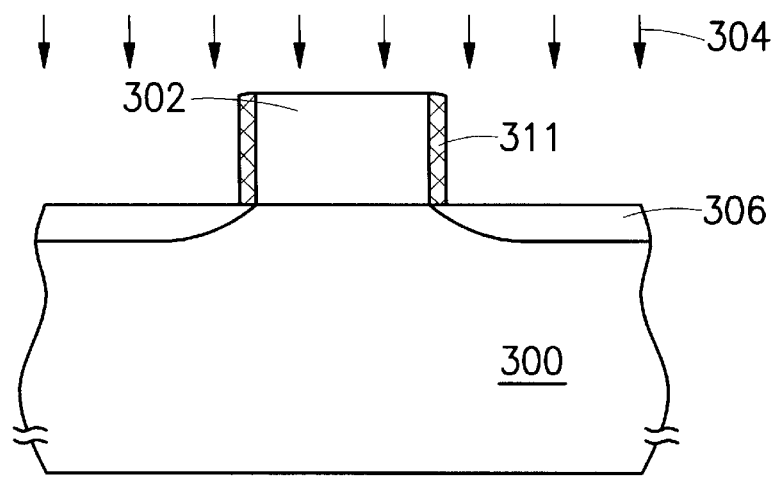
FIGS. 3A through 3C are schematic cross-sectional views showing the progression of steps for fabricating a low-leakage, high-performance device according to a second preferred embodiment of this invention.
Figure 3B:
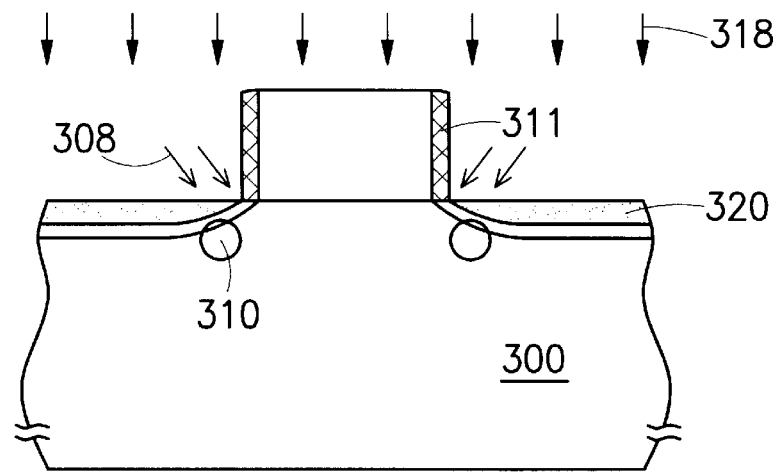
Figure 3C:
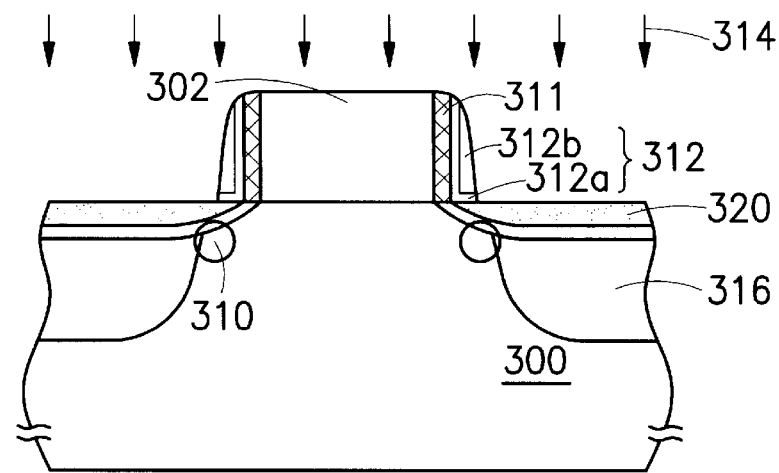

FIGS. 3A through 3C are schematic cross-sectional views showing the progression of steps for fabricating a low-leakage, high-performance device according to a second preferred embodiment of this invention.

As shown in FIG. 3A, a substrate 300 having a gate electrode 302 thereon is provided. A lightly doped drain (LDD) implantation 304 of the substrate 300 is conducted to form a lightly doped source/drain terminal 306 in the substrate 300. An offset spacer 311 is formed on each sidewall of the gate electrode 302. The offset spacer 311, for example, can be a silicon oxide layer having a thickness between about 100~500 Å. A dosage of, for example, between about $10^{13} \sim 10^{14}$ ions/cm$^2$ is used to conduct the LDD implantation 304.

As shown in FIG. 3B, a heavily doped drain (HDD) implantation 318 is conducted to form a heavily doped source/drain terminal 320 in the substrate 300. The heavily doped source/drain terminal 320 has a depth smaller than the lightly doped source/drain terminal 306. A halo implantation 308 is next conducted to form a locally doped pocket 310 on each side of the gate electrode 302 under the heavily doped source/drain terminal 320. A dosage of, for example, greater than $10^{15}$ ions/cm$^2$ is used to conduct the HDD implantation 318.

As shown in FIG. 3C, a spacer structure 312 is formed on each sidewall of the gate electrode 302 and above the substrate 300. The spacer structure 312 is formed, for example, by depositing an oxide protective layer 312a on the sidewalls of the gate electrode 302 and over the substrate 300 and then depositing a spacer layer 312b over the protective layer 312a. The spacer layer 312b can be a silicon nitride layer, for example. A deep-penetrating source/drain implantation 314 is conducted to form a deep source/drain terminal 316.

Figure 3D:
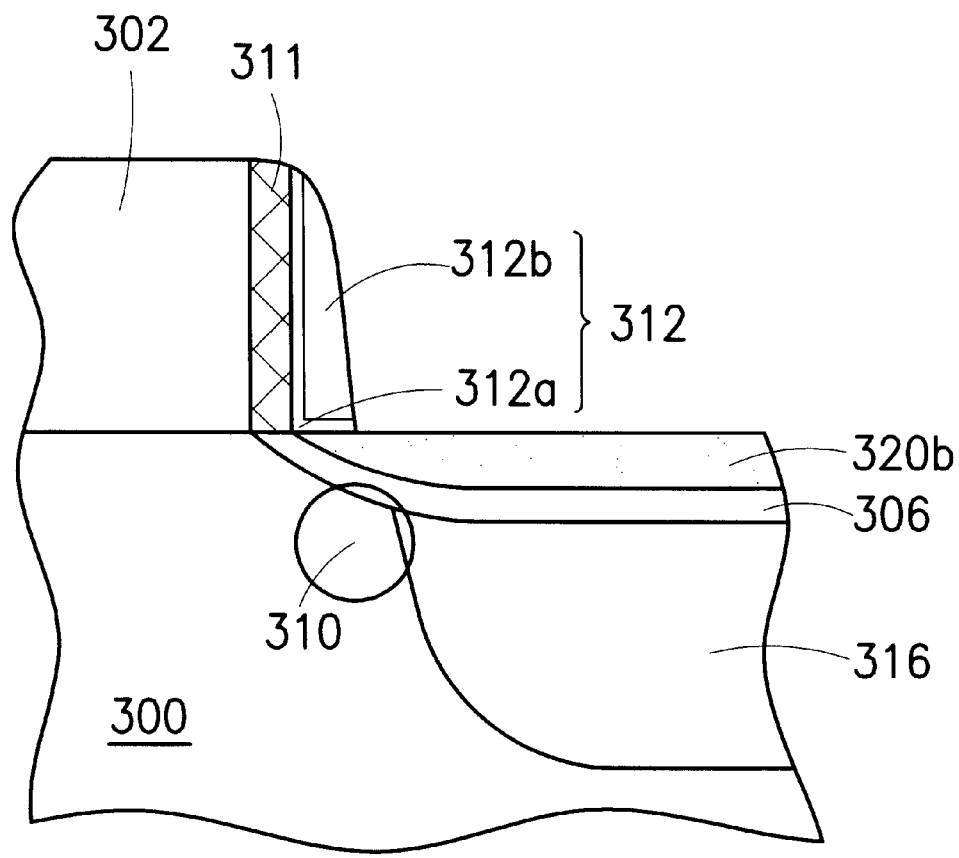
FIG. 3D is a cross-sectional diagram showing in detail the structure after a thermal treatment of the device shown in FIG. 3C.

FIG. 3D is a cross-sectional diagram showing in detail the structure after a thermal treatment of the device shown in FIG. 3C. After an ion implantation, a thermal treatment of the silicon chip is required to compensate for surface amorphization. During thermal treatment, dopants in the heavily doped source/drain terminal 320 are prevented from diffusing through the offset spacer 211. Therefore, no dopants can be driven into the region directly underneath the gate electrode 302 to cause a shortening of the channel between the source/drain terminal.

In this invention, a deeper but lightly doped drain layer is formed in the substrate. Hence, overlapping of the source/drain terminal with gate channel is greatly reduced. Furthermore, a heavily doped source/drain layer is formed in the substrate. Thus, the problem of having higher parasitic capacitance due to fewer dopants in LDD region can be relieved. Consequently, a device having a lower current leak and a higher performance is obtained.

In summary, the advantages of the invention includes:

1. A lightly doped, high-energy source/drain doped layer is formed before the fabrication of the offset spacers. Since the lightly doped layer has low dopant concentration but considerable depth, overlapping with the channel can be prevented. Hence, gate-induced drain leakage (GIDL) and gate-to-drain capacitance can be greatly reduced. Thus, a low leakage and high operating speed device is produced.

2. A heavily doped source/drain layer is formed after the fabrication of the offset spacers. Since the heavily doped source/drain layer has high dopant concentration, parasitic capacitance and hence RC delay of the source/drain terminal is reduced. In addition, since the heavily doped source/drain region is formed after the offset spacer, the offset spacers can serve as a buffer for diffusing ions during thermal treatment. Therefore, ions are prevented from diffusing into the region under the gate electrode so that width of the channel between the source/drain terminals can be maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a low-leakage, high-performance device, comprising the steps of:

providing a substrate having a gate electrode thereon;

performing a lightly doped drain implantation to form a lightly doped source/drain terminal having a first depth in the substrate on each side of the gate electrode;

forming an offset spacer on each sidewall of the gate electrode;

performing a heavily doped implantation to form a heavy doped source/drain terminal having a second depth in the substrate, wherein the first depth is greater than the second depth;

forming a spacer structure on each sidewall of the gate electrode and over the substrate; and performing a deep-penetrating source/drain implantation to form a source/drain terminal in the substrate.

2. The method of claim 1, wherein the step of performing the lightly doped drain implantation includes implanting dopants at a dosage level of about $10^{13}$~$10^{14}$ ions/cm$^2$.

3. The method of claim 1, wherein the step of performing the heavily doped implantation includes implanting dopants at a dosage level greater than $10^{15}$ ions/cm$^2$.

4. The method of claim 1, wherein after the step of performing the lightly doped drain implantation, further includes performing a halo implantation to form a locally doped pocket on each side of the gate electrode under the lightly doped source/drain terminal.

5. The method of claim 1, wherein after the step of performing the heavily doped implantation, further includes performing a halo implantation to form a locally doped pocket on each side of the gate electrode under the lightly doped source/drain terminal.

6. The method of claim 1, wherein the offset spacer has a thickness between about 100~500 Å.

7. The method of claim 1, wherein the step of forming the spacing structure includes the substeps of:

forming and patterning a protective layer on the sidewalls of the gate electrode and over the substrate; and forming a spacer layer over the protective layer.

8. The method of claim 7, wherein material constituting the spacer layer includes silicon nitride.

9. The method of claim 1, wherein material constituting the offset spacer includes silicon oxide.

10. A method of forming a low-leakage, high-performance device, comprising the steps of:

providing a substrate having a gate electrode thereon;

performing a lightly doped drain implantation to form a lightly doped source/drain terminal having a first depth in the substrate;

forming an offset spacer on each sidewall of the gate electrode;

performing a heavily doped implantation to form a heavy doped source/drain terminal having a second depth in the substrate, wherein the first depth is greater than the second depth;

forming a spacer structure on each sidewall of the gate electrode and over the substrate; and performing a deep-penetrating source/drain implantation to form a source/drain terminal in the substrate.

11. The method of claim 10, wherein the step of performing the lightly doped drain implantation includes implanting dopants at a dosage level of about $10^{13}$~$10^{14}$ ions/cm$^2$.

12. The method of claim 10, wherein the step of performing the heavily doped implantation includes implanting dopants at a dosage level greater than $10^{15}$ ions/cm$^2$.

13. The method of claim 10, wherein after the step of performing the lightly doped drain implantation, further includes performing a halo implantation to form a locally doped pocket on each side of the gate electrode under the lightly doped source/drain terminal.

14. The method of claim 10, wherein after the step of performing the heavily doped implantation, further includes performing a halo implantation to form a locally doped pocket on each side of the gate electrode under the lightly doped source/drain terminal.

15. The method of claim 10, wherein the offset spacer has a thickness between about 100~500 Å.

16. The method of claim 10, wherein the step of forming the spacing structure includes the substeps of:

forming and patterning a protective layer on the sidewalls of the gate electrode and over the substrate; and forming a spacer layer over the protective layer.

17. The method of claim 16, wherein material constituting the spacer layer includes silicon nitride.

18. The method of claim 10, wherein material constituting the offset spacer includes silicon oxide.

* * * * *